United States Patent
Sasaki et al.

(10) Patent No.: US 7,959,729 B2
(45) Date of Patent: Jun. 14, 2011

(54) METHOD FOR PRODUCING GROUP-III-ELEMENT NITRIDE SINGLE CRYSTALS AND APPARATUS USED THEREIN

(75) Inventors: Takatomo Sasaki, Suita (JP); Yusuke Mori, Suita (JP); Masashi Yoshimura, Suita (JP); Fumio Kawamura, Suita (JP); Hidekazu Umeda, Suita (JP)

(73) Assignee: Osaka University, Osaka (JP)

( * ) Notice: Subject to any disclaimer, the term of this patent is extended or adjusted under 35 U.S.C. 154(b) by 389 days.

(21) Appl. No.: 10/549,494

(22) PCT Filed: Mar. 15, 2004

(86) PCT No.: PCT/JP2004/003391
§ 371 (c)(1),
(2), (4) Date: Sep. 15, 2005

(87) PCT Pub. No.: WO2004/083498
PCT Pub. Date: Sep. 30, 2004

(65) Prior Publication Data
US 2006/0169197 A1    Aug. 3, 2006

(30) Foreign Application Priority Data
Mar. 17, 2003   (JP) .............................. 2003-072687

(51) Int. Cl.
*C30B 9/12*   (2006.01)
(52) U.S. Cl. ................ 117/73; 117/68; 117/74; 117/75; 117/78; 117/223; 117/224; 117/952
(58) Field of Classification Search ............ 117/68, 117/73, 74, 75, 78, 223, 224, 952
See application file for complete search history.

(56) References Cited

U.S. PATENT DOCUMENTS
3,811,963 A * 5/1974 Howrylo et al. ............. 117/64
(Continued)

FOREIGN PATENT DOCUMENTS
EP   1 201 793   5/2002
(Continued)

OTHER PUBLICATIONS
Patent Abstracts of Japan. English Abstract of JP 2002-68896A (2002).*
Kawamura et al., "Growth of large GaN single crystal using the liquid phase epitaxy (LPE) technique.", Jpn. J. Appl. Phys. vol. 42 (2003). pp. L4-L6.*

(Continued)

*Primary Examiner* — Matthew J Song
(74) *Attorney, Agent, or Firm* — Hamre, Schumann, Mueller & Larson, P.C.

(57) ABSTRACT

A production method is provided in which Group-III-element nitride single crystals that have a lower dislocation density and a uniform thickness and are transparent, high quality, large, and bulk crystals can be produced with a high yield. The method for producing Group-III-element nitride single crystals includes: heating a reaction vessel containing at least one metal element selected from the group consisting of an alkali metal and an alkaline-earth metal and at least one Group III element selected from the group consisting of gallium (Ga), aluminum (Al), and indium (In) to prepare a flux of the metal element; and feeding nitrogen-containing gas into the reaction vessel and thereby allowing the Group III element and nitrogen to react with each other in the flux to grow Group-III-element nitride single crystals, wherein the single crystals are grown, with the flux being stirred by rocking the reaction vessel, for instance.

12 Claims, 5 Drawing Sheets

U.S. PATENT DOCUMENTS

| | | | | |
|---|---|---|---|---|
| 3,858,553 | A | * | 1/1975 | Scheel ............... 118/421 |
| 5,366,552 | A | * | 11/1994 | Yamada et al. ........ 118/416 |
| 5,868,837 | A | | 2/1999 | DiSalvo et al. |
| 6,270,569 | B1 | * | 8/2001 | Shibata et al. ........ 117/68 |
| 6,398,867 | B1 | * | 6/2002 | D'Evelyn et al. ...... 117/11 |
| 6,531,072 | B1 | * | 3/2003 | Suda et al. ........ 252/301.4 R |
| 2002/0046695 | A1 | * | 4/2002 | Sarayama et al. ...... 117/84 |
| 2002/0175338 | A1 | | 11/2002 | Sarayama et al. |

FOREIGN PATENT DOCUMENTS

| | | | | |
|---|---|---|---|---|
| JP | 75011870 | B | * | 5/1975 |
| JP | 60-122797 | | | 7/1985 |
| JP | 01242483 | A | * | 9/1989 |
| JP | 2000-327495 | | | 11/2000 |
| JP | 2001-53013 | | | 2/2001 |
| JP | 2002-68896 | | | 3/2002 |
| JP | 2002068896 | A | * | 3/2002 |
| JP | 2002-293696 | | | 10/2002 |
| JP | 2003-527296 | | | 9/2003 |
| WO | 01/68955 | | | 9/2001 |

OTHER PUBLICATIONS

Kawamura et al., "Synthesis of Bulk GaN single crystals using Na-Ca flux", Jpn. J. Appl. Phys. vol. 41 (2002). pp. L1440-L1442.*

Derwent Abstract of JP 75011870 B (1975).*

Patent Abstracts of Japan. English Abstract of JP 01-242483 (1989).*

Kawamura, et al.. "Novel Liquid Phase Epitaxy (LPE) Growth Method for Growing Large GaN Single Crystals: Introduction of the Flux Film Coated-Liquid Phase Epitaxy (FFC-LPE) Method", Jpn. J. Appl. Phys. vol. 42 (2003), pp. L-829-L-881, Part 2, No. 8A Aug. 1, 2003.

Grzegory, et al., "III-V Nitrides—Thermodynamics and Crystal Growth at High $N_2$ Pressure", J. Phys. Chem. Solids, vol. 56. No. 3/4. pp. 639-647, 1995.

Song, et al., "Buld GaN single crystals: growth conditions by flux method", Journal of Crystal Growth 247 (2003). pp. 275-278.

Kawamura, et al.. "Synthesis of Bulk GaN Single Crystals Using Na-Ca Flux". Jpn. J. Appl. Phys. vol. 41, (2002), pp. L1440-L1442.

* cited by examiner

METHOD FOR PRODUCING GROUP-III-ELEMENT NITRIDE SINGLE CRYSTALS AND APPARATUS USED THEREIN

TECHNICAL FIELD

The present invention relates to a method for producing single crystals of Group-III-element nitride.

BACKGROUND ART

Group-III-element nitride semiconductors are used in the fields of, for instance, hetero-junction high-speed electron devices and photoelectron devices (such as laser diodes, light-emitting diodes, sensors, etc). Particularly, gallium nitride (GaN) has been gaining attention. Conventionally, in order to obtain single crystals of gallium nitride, gallium and nitrogen gas are allowed to react with each other directly (see J. Phys. Chem. Solids, 1995, 56, 639). In this case, however, ultrahigh temperature and pressure, specifically 1300° C. to 1600° C. and 8000 atm to 17000 atm (0.81 MPa to 1.72 MPa) are required. In order to solve this problem, a technique of growing gallium nitride single crystals in a sodium (Na) flux (hereinafter also referred to as a "Na flux method") has been developed (see, for instance, U.S. Pat. No. 5,868,837). This method allows the heating temperature to be decreased considerably to 600° C. to 800° C. and also allows the pressure to be decreased down to about 50 atm (about 5 MPa). In this method, however, the resulting single crystals are blackened and there therefore is a problem of quality. Furthermore, the conventional techniques do not make it possible to produce gallium nitride single crystals that have a lower dislocation density and a uniform thickness (i.e. a substantially level crystal surface) and are transparent, high quality, large, and bulk crystals. In addition, the conventional techniques have a lower yield. That is, in the conventional techniques, the growth rate is particularly low, and even the largest diameter of the largest gallium nitride single crystals that have been reported until now is about 1 cm, which does not allow gallium nitride to be used practically. For instance, a method has been reported in which lithium nitride ($Li_3N$) and gallium are allowed to react with each other to grow gallium nitride single crystals (see Journal of Crystal Growth 247(2003)275-278). However, the size of the crystals obtained using the method was only about 1 mm to 4 mm. These problems are not peculiar to gallium nitride. The same applies to semiconductors of other Group-III-element nitrides.

DISCLOSURE OF INVENTION

The present invention was made in consideration of such situations. An object of the present invention is to provide a production method that makes it possible to produce Group-III-element nitride single crystals with a high yield, with the Group-III-element nitride single crystals having a lower dislocation density and a uniform thickness and being transparent, high quality, large, and bulk single crystals.

In order to achieve the above-mentioned object, the method for producing Group-III-element nitride single crystals of the present invention includes: heating a reaction vessel containing at least one metal element selected from the group consisting of an alkali metal and an alkaline-earth metal and at least one Group III element selected from gallium (Ga), aluminum (Al), and indium (In) to prepare a flux of the metal element; and feeding nitrogen-containing gas into the reaction vessel and thereby allowing the Group III element and nitrogen to react with each other in the flux to grow Group-III-element nitride single crystals, wherein the single crystals are grown, with the flux and the Group III element having been stirred to be mixed together.

As described above, when gallium and nitrogen are reacted with each other in the flux, with the flux and the Group III element having been stirred to be mixed together, the speed at which the nitrogen dissolves in the liquid mixture increases, the gallium and nitrogen distribute uniformly in the flux, and in addition, a fresh raw material can be supplied continuously to the growth faces of crystals. Accordingly, Group-III-element nitride single crystals can be produced quickly that have a lower dislocation density and a uniform thickness and are transparent, high quality, large, and bulk single crystals. According to the studies made by the present inventors and others, it has been proved that if no actions are taken, the flux and the Group III element need a long period of time to be mixed together and in this case, nitrogen is difficult to dissolve, which results in a lower growth rate and non-uniform nitrogen distribution and thus makes it difficult to improve the quality of crystals to be obtained.

DESCRIPTION OF THE INVENTION

Figure 1:
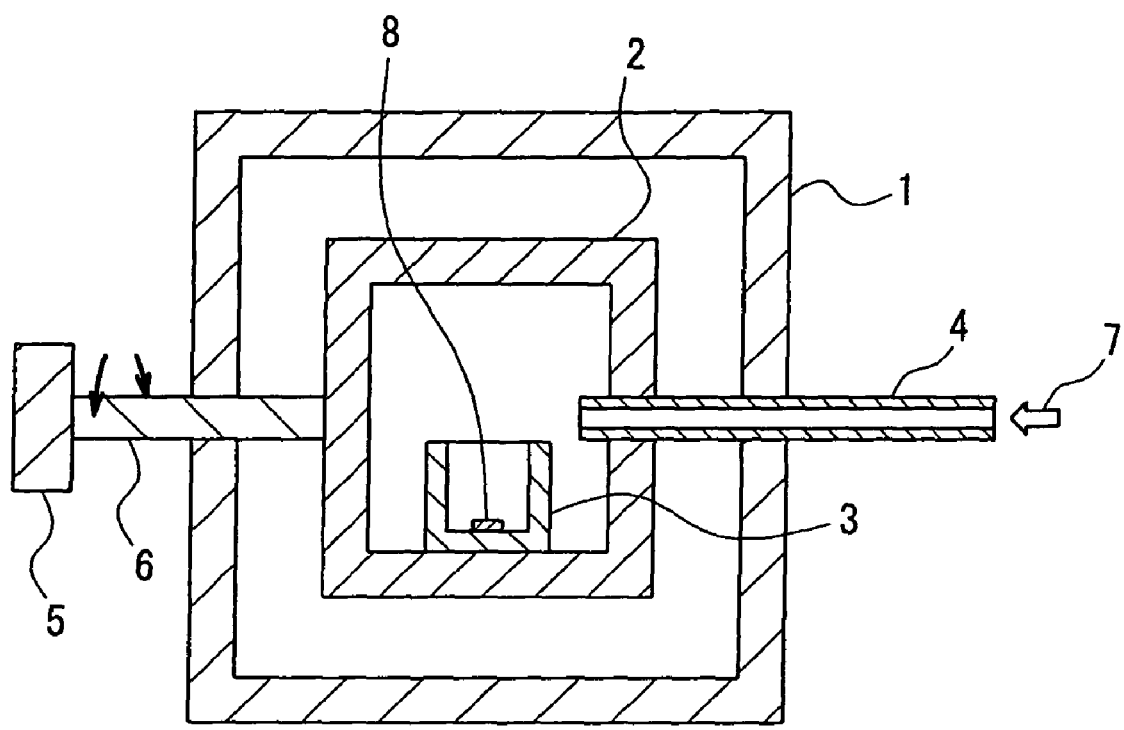
FIG. 1 is a cross-sectional view showing an example of the manufacturing apparatus according to the present invention.

Hereafter, the present invention is described further in detail using examples.

In the present invention, the flux and the Group III element can be stirred to be mixed together by, for instance, rocking the reaction vessel, rotating the reaction vessel, or a combination thereof. In addition, the flux and the Group III element also can be stirred to be mixed together by, for instance, not only heating the reaction vessel for preparing the flux but also heating the lower part of the reaction vessel to generate heat convection. Furthermore, they may be stirred to be mixed together using a stirring blade. These respective means for stirring them to mix them together can be combined with each other.

In the present invention, the manner of rocking the reaction vessel is not particular limited. For instance, the reaction vessel is rocked in a certain direction, wherein the reaction vessel is tilted in one direction and then is tilted in the opposite direction to the one direction. This rocking motion may be a regular motion or an intermittent irregular motion. Furthermore, a rotational motion may be employed in addition to the rocking motion. The tilt of the reaction vessel caused during the rocking also is not particularly limited. In the case of a regular rocking motion, the reaction vessel is rocked in a cycle of, for instance, 1 second to 10 hours, preferably 30 seconds to 1 hour, and more preferably 1 minute to 20 minutes. The maximum tilt angle of the reaction vessel during rocking with respect to the center line extending in the height direction of the reaction vessel is, for instance, 5 degrees to 70 degrees, preferably 10 degrees to 50 degrees, and more preferably 15 degrees to 45 degrees. Moreover, as described later, when a substrate is placed on the bottom of the reaction vessel, the reaction vessel may be rocked in the state where the Group-III-element nitride thin film formed on the substrate is covered continuously with the flux or in the state where the flux does not cover the substrate when the reaction vessel is tilted.

In the present invention, the reaction vessel may be a crucible.

In the production method of the present invention, it is preferable that a substrate be placed in the reaction vessel, a thin film of Group-III-element nitride be formed on the surface of the substrate beforehand, and then Group-III-element nitride single crystals be grown on the thin film.

The Group-III-element nitride of the thin film formed on the substrate may be single crystals or may be amorphous. Examples of the material to be used for the substrate include amorphous gallium nitride (GaN), amorphous aluminum nitride (MN), sapphire, silicon (Si), gallium arsenic (GaAs), gallium nitride (GaN), aluminum nitride (AlN), silicon carbide (SiC), boron nitride (BN), lithium gallium oxide ($LiGaO_2$), zirconium boride ($ZrB_2$), zinc oxide (ZnO), various glasses, various metals, boron phosphide (BP), $MoS_2$, $LaAlO_3$, NbN, $MnFe_2O_4$, $ZnFe_2O_4$, ZrN, TiN, gallium phosphide (GaP), $MgAl_2O_4$, $NdGaO_3$, $LiAlO_2$, $ScAlMgO_4$, $Ca_8La_2(PO_4)_6O_2$, etc. The thickness of the thin film is not particularly limited but may be in the range of, for instance, 0.0005 μm to 100000 μm, preferably 0.001 μm to 50000 μm, and more preferably 0.01 μm to 5000 μm. The Group-III-element nitride thin film can be formed on the substrate by, for example, a metalorganic chemical vapor deposition method (a MOCVD method), a hydride vapor phase epitaxy (HVPE), a molecular beam epitaxy method (a MBE method), etc. Since products in which a thin film of Group-III-element nitride such as gallium nitride has been formed on a substrate are commercially available, they may be used. The largest diameter of the thin film is, for instance, at least 2 cm, preferably at least 3 cm, and more preferably at least 5 cm. The larger the largest diameter, the more preferable the thin film. The upper limit thereof is not limited. However, sic the standard for bulk compound semiconductors is two inches, from this viewpoint, the largest diameter preferably is 5 cm. In this case, the largest diameter is in the range of, for instance, 2 cm to 5 cm, preferably 3 cm to 5 cm, and more preferably 5 cm. In this context, the "largest diameter" is the length of the longest line that extends between one point and another point on the periphery of the thin film surface.

In this production method, there is a possibility that the Group-III-element nitride thin film formed on the substrate beforehand is melted by the flux before the nitrogen concentration rises. In order to prevent this from occurring, it is preferable that nitride be allowed to be present in the flux at least at an early stage of the reaction. Examples of the nitride include $Ca_3N_2$, $Li_3N$, $NaN_3$, BN, $Si_3N_4$, InN, etc. They may be used individually, or two or more of them may be used together. Furthermore, the ratio of the nitride contained in the flux is, for instance, 0.0001 mol % to 99 mol %, preferably 0.001 mol % to 50 mol %, and more preferably 0.005 mol % to 5 mol %.

In the production method of the present invention, the single crystals preferably are grown, with the flux that contains the Group III element flowing, in a thin layer state, continuously or intermittently on the surface of the thin film formed on the substrate, by rocking the reaction vessel. When the flux is in a thin layer state, the nitrogen-containing gas dissolves easily in the flux. This allows a large amount of nitrogen to be supplied continuously to the growth faces of the crystals. Moreover, when the reaction vessel is rocked regularly in one direction, the flux flows regularly on the thin film, which allows the step flow of the growth faces of the crystals to be stable. This results in further uniform thickness and thus allows high quality single crystals to be obtained.

In the production method of the present invention, it is preferable that before the single crystals start growing, the reaction vessel be tilted in one direction to pool the flux containing the Group III element on the bottom of the reaction vessel on the side to which the reaction vessel is tilted and thereby the flux prevented from coming into contact with the surface of the thin film of the substrate. In this case, the flux can be supplied onto the thin film of the substrate by rocking the reaction vessel after it is confirmed that the temperature of the flux has risen satisfactorily. As a result, formation of undesired compounds or the like are prevented and thus higher quality single crystals can be obtained.

In the production method of the present invention, it is preferable that after the single crystals finish growing, the reaction vessel be tilted in one direction to remove the flux containing the Group III element from the surface of the thin film of the substrate and to pool it on the side to which the reaction vessel is tilted. In this case, when the internal temperature of the reaction vessel has decreased after the single crystals finish growing, the flux does not come into contact with the single crystals that have been obtained. As a result, this can prevent any low quality crystals from growing on the single crystals that have been obtained.

The manner of heating the reaction vessel for generating the heat convection is not particularly limited as long as it is carried out under conditions that allow heat convection to be generated. The position of the part of the reaction vessel to be heated is not particularly limited as long as it is a lower part of the reaction vessel. For instance, the bottom part or the side wall of the lower part of the reaction vessel may be heated. The temperature at which the reaction vessel is heated for generating the heat convection is, for instance, 0.01° C. to 500° C. higher than the heating temperature that is employed for preparing the flux, preferably 0.1° C. to 300° C. higher than that, more preferably 1° C. to 100° C. higher than that. A common heater can be used for the heating.

The manner of stirring the flux and the Group III element to mix them together using the stirring blade is not particularly limited. For instance, it may be carried out through a rotational motion or a reciprocating motion of the stirring blade or a combination thereof. In addition, it may be carried out through a rotational motion or a reciprocating motion of the reaction vessel with respect to the stirring blade or a combination thereof. Furthermore, it may be carried out through a combination of the motion of the stirring blade itself and the motion of the reaction vessel itself The stirring blade is not particularly limited. The shape and material to be employed for the stirring blade can be determined suitably according to, for instance, the size and shape of the reaction vessel. It, however, is preferable that the stirring blade be formed of a material that is free from nitrogen and has a melting point or a decomposition temperature of at least 2000° C. This is because when formed of such a material, the stirring blade is not melted by the flux and can prevent crystal nucleation from occurring on the surface of the stirring blade.

Examples of the material to be used for the stirring blade include rare-earth oxides, alkaline-earth metal oxides, W, SiC, diamond, diamond-like carbon, etc. A stirring blade formed of such a material also is not melted by the flux and can prevent crystal nucleation from occurring on the surface of the stirring blade, as in the case described above. Examples of the rare earth and the alkaline-earth metals include Sc, Y, La, Ce, Pr, Nd, Pm, Sm, Eu, Gd, Tb, Dy, Ho, Er, Tm, Yb, Be, Mg, Ca, Sr, Ba, and Ra. Preferable materials to be used for the stirring blade are $Y_2O_3$, CaO, MgO, W, SiC, diamond, diamond-like carbon, etc. Among them, $Y_2O_3$ is the most preferable.

In the production method of the present invention, it is preferable that a Group III element and a doping material be supplied to the flux while the single crystals are growing. This allows the crystals to grow continuously for a longer period of time. The method of supplying the Group III element is not particularly limited but the following method may be employed. That is, a reaction vessel is formed of two parts including an inner part and an outer part and the outer part is divided into several small chambers. Each of the small chambers is provided with a door that can be opened and closed from the outside. A material to be supplied to the small chambers is put into the small chambers beforehand. When the door of a small chamber that is located on the higher side of the reaction vessel during rocking is opened, the material contained in the small chamber flows down to the inner part of the reaction vessel by gravity and then is mixed together. Further, when a small chamber of the outer part is empty, a first material that was used for growing crystals initially is removed and another material that is different from the first material and that has been put into a small chamber that is located in the opposite side is put into the inner part of the reaction vessel, so that Group III nitride semiconductor crystals can be grown sequentially in which the ratio of the Group III element and the type of the doping material are varied. Changing the direction of rocking (for instance, employing both the rocking motion and the rotational motion) makes it possible to increase the number of small chambers of the outer part that can be used and to make many materials containing various compositions and impurities available.

In the present invention, the Group III element is gallium (Ga), aluminum (Al), or indium (In). Among them, however, gallium is preferable. In addition, it is preferable that the Group-III-element nitride single crystals be gallium nitride (GaN) single crystals. The conditions described below are particularly suitable for producing single crystals of gallium nitride but also can be employed for producing single crystals of other Group-III-element nitrides.

In the production method of the present invention, the alkali metals to be used are lithium (Li), sodium (Na), potassium (K), rubidium (Rb), cesium (Cs), and francium (Fr) while the alkaline-earth metals to be used are calcium (Ca), strontium (Sr), barium (Br), and radium (Ra). They may be used individually, or two or more of them may be used together. Among them, Li, Na, Ca, K, Rb, and Cs are preferable, Li, Na, and Ca are more preferable, and a mixed flux of Na and Ca and a mixed flux of Na and Li are further preferable. In these cases, the ratio (mol %) of calcium (Ca) or lithium (Li) to the sum of sodium (Na) and calcium (Ca) or lithium (Li) is in the range of, for instance, 0.1 mol % to 99 mol %, preferably 0.1 mol % to 50 mol %, and more preferably 2.5 mol % to 30 mol %. On the other hand, the ratio (mol %) of sodium (Na) to the sum of gallium (Ga) and sodium (Na) is in the range of, for instance, 0.1 mol % to 99.9 mol %, preferably 30 mol % to 99 mol %, and more preferably 60 mol % to 95 mol %. The particularly preferable mol ratio of gallium:sodium:lithium or calcium is 3.7:9.75:0.25.

In the production method of the present invention, the conditions for the dissolving include for instance, a temperature of 100° C. to 1500° C. and a pressure of 100 Pa to 20 MPa, preferably a temperature of 300° C. to 1200° C. and a pressure of 0.01 MPa to 10 MPa, and more preferably a temperature of 500° C. to 1100° C. and a pressure of 0.1 MPa to 6 MPa.

In the production method of the present invention, the nitrogen(N)-containing gas is, for instance, nitrogen ($N_2$) gas or ammonia ($NH_3$) gas. They may be mixed together and the mixing ratio thereof is not limited. The use of ammonia gas is particularly preferable since it allows the reaction pressure to decrease.

In the production method of the present invention, impurities can be present in the flux. In this case, gallium nitride single crystals containing impurities can be produced. Examples of the impurities include calcium (Ca), a compound containing calcium (Ca), silicon (Si), alumina ($Al_2O_3$), indium (In), aluminum (Al), indium nitride (InN), silicon nitride ($Si_3N_4$), silicon oxide ($SiO_2$), indium oxide ($In_2O_3$), zinc (Zn), magnesium (Mg), zinc oxide (ZnO), magnesium oxide (MgO), and germanium (Ge).

In the production method of the present invention, it is preferable that the flux and the Group III element be stirred to be mixed together, which is carried out in an atmosphere of inert gas other than nitrogen first and then in an atmosphere of the nitrogen-containing gas that is obtained by substituting the inert gas by the nitrogen-containing gas. That is, there is a possibility that the flux and the Group III element have not been mixed well in the early stage of stirring them to mix them together, and in this case, there is a possibility that the flux components react with nitrogen to form nitride. The production of nitride can be prevented when the nitrogen-containing gas is not present. In the unpressurized state, however, there is a possibility that the high temperature flux and Group III element evaporate. In order to solve this problem, it is preferable that in the early stage of stirring the flux and the Group III element to mix them together, they be stirred to be mixed together in an atmosphere of inert gas other than nitrogen, and then the stirring be continued, with the inert gas being substituted by the nitrogen-containing gas, as described above. In this case, it is preferable that the substitution be carried out gradually. The inert gas to be used herein can be argon gas or helium gas, for instance.

The apparatus of the present invention is used in the method for producing Group-III-element nitride single crystals of the present invention. The apparatus includes: a means for heating a reaction vessel for preparing a flux by heating at least one metal element selected from the group consisting of an alkali metal and an alkaline-earth metal contained in the reaction vessel; a means for feeding nitrogen-containing gas to be used for reacting the Group III element contained in the flux and nitrogen to each other by feeding the nitrogen-containing gas into the reaction vessel; and a rocking means for rocking the reaction vessel in a certain direction by tilting the reaction vessel in one direction and then tilting it in the opposite direction to the one direction. Preferably, the apparatus is provided with a means for rotating the reaction vessel in addition to or instead of the rocking means.

An example of the apparatus of the present invention is shown with the cross-sectional view in FIG. 1. As shown in FIG. 1, in this apparatus, a heating container 2 is disposed in a heat- and pressure-resistant container 1. A pipe 4 for feeding nitrogen-containing gas 7 is connected to the heating container 2. In addition, a shaft 6 that extends from a rocking device 5 also is connected to the heating container 2. The rocking device 5 is composed of a motor, a mechanism for controlling the rotation thereof, etc. An example of the production method of the present invention that is carried out using this apparatus is described below with respect to the production of GaN single crystals.

Figure 2:
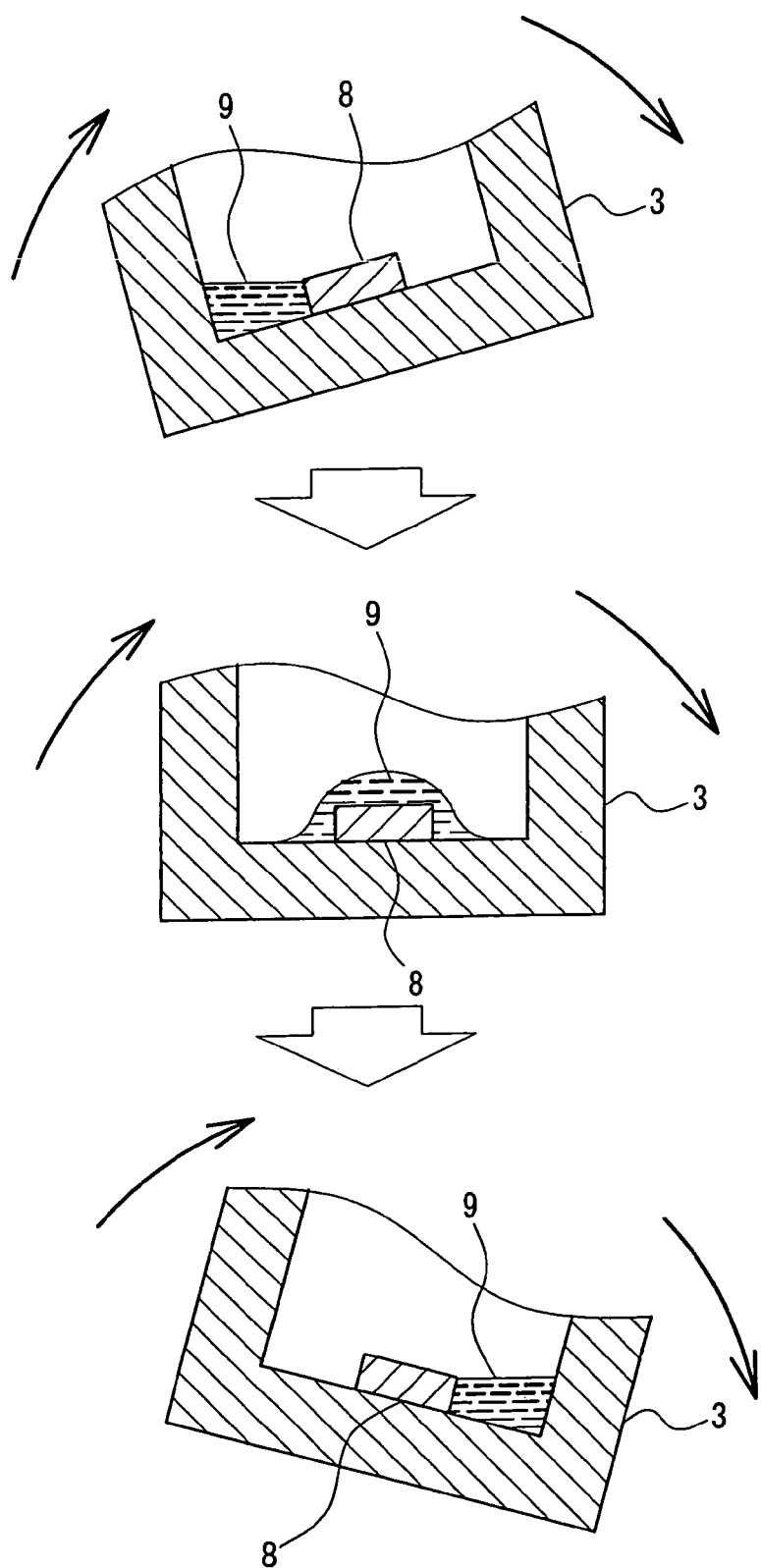
FIG. 2 shows cross-sectional views illustrating rocking states in an example of the production method according to the present invention.

First, a substrate 8 with a GaN thin film formed on the surface thereof is placed on the bottom of a reaction vessel 3. Then gallium and metal elements such as sodium, calcium, lithium, etc. to be used as a raw material of a flux are put into the reaction vessel 3. This reaction vessel 3 then is placed in the heating container 2. Thereafter, the heating container 2 as a whole is tilted with the rocking device 5 and the shaft 6, so that the surface of the thin film formed on the substrate 8 is prevented from being in contact with the gallium, the flux raw material, etc. In this state, heating is started. After the temperature becomes sufficiently high and thereby the flux is brought into a preferable state, the whole heating container 2 is rocked by the rocking device 5 and thereby the reaction vessel is rocked. An example of the flow of the flux caused by this rocking is shown in FIG. 2. In FIG. 2, the same parts as those shown in FIG. 1 are indicated with the same numerals. As shown in FIG. 2, in the reaction vessel 3 tilted to the left, the flux 9 pools on the left side on the bottom of the reaction vessel 3 and therefore is not in contact with the surface of the substrate 8. As indicated with an arrow, when the reaction vessel 3 is stood upright, the flux 9 covers the surface of the substrate 8, in a thin-film state. Further, when the reaction vessel 3 is tilted to the right, the flux 9 flows to be pooled on the right side on the bottom of the reaction vessel 3, which prevents the flux 9 from coming into contact with the surface of the substrate 8. When this motion is carried out so as to tilt the reaction vessel 3 from the right to the left, the flux 9 flows in the opposite direction to the above-mentioned direction. During this rocking, when nitrogen-containing gas 7 is fed into the heating container 2 and the reaction vessel 3 through the pipe 4, the gallium and nitrogen react with each other in the flux 9 to form gallium nitride single crystals on the surface of the gallium nitride thin film of the substrate 8. In this case, feeding of the nitrogen-containing gas may be started before the rocking motion starts or may be started after the rocking motion starts as described above. When crystal growth is completed, the reaction vessel 3 is brought into a tilted state to prevent the flux 9 from coming into contact with the gallium nitride single crystals newly obtained on the substrate 8. Then after the internal temperature of the heating container 2 has fallen, the gallium nitride single crystals are collected without being separated from the substrate 8. In this example, the substrate was placed on the center of the bottom of the reaction vessel. The present invention, however, is not limited thereto and the substrate may be placed in a place that is apart from the center.

The material to be used for the reaction vessel that is employed in the production method of the present invention is not particularly limited. Examples of the material to be used herein include BN, AlN, alumina, SiC, graphite, carbon-based materials such as diamond-like carbon, etc. Among them, AlN, SiC, diamond-like carbon are preferable. Examples of the reaction vessel include a BN crucible, an AlN crucible, an alumina crucible, a SiC crucible, a graphite crucible, a crucible made of a carbon-based material such as diamond-like carbon, etc. Among them, the AlN crucible, the SiC crucible, and the diamond-like carbon crucible are preferable because they tend not to dissolve in the flux. Furthermore, a crucible whose surface is coated with such a material also may be used.

Figure 3:
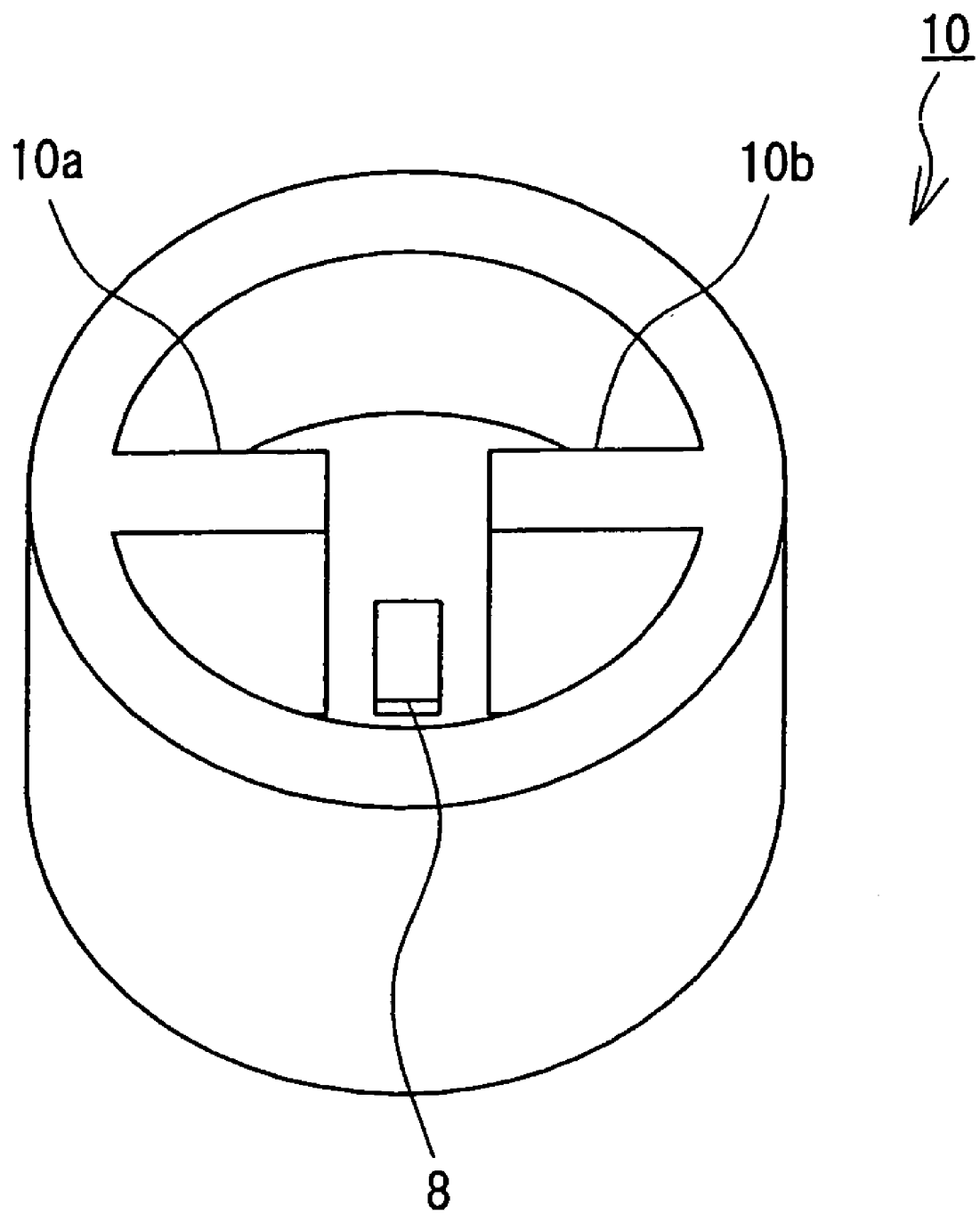
FIG. 3 is a perspective view showing an example of the reaction vessel according to the present invention.

In addition, the shape of the reaction vessel (or the crucible) to be used in the production method of the present invention also is not particularly limited. It, however, is preferable that the reaction vessel has a cylindrical shape and includes two projections that protrude from the inner wall thereof toward the circular center, and a substrate placed between the two projections. Such a shape allows the flux to flow concentrating on the surface of the substrate placed between the two projections when the reaction vessel is rocked. An example of this reaction vessel is shown in FIG. 3. As shown in FIG. 3, this reaction vessel 10 has a cylindrical shape and includes two wall-like projections 10a and 10b that protrude toward the circular center. A substrate 8 is placed between the projections 10a and 10b. The conditions for using the reaction vessel with such a shape are not limited except that the reaction vessel is rocked in the direction perpendicular to the direction in which the two projections protrude.

Transparent Group-III-element nitride single crystals that are obtained by the production method of the present invention have a dislocation density of $10^4/cm^2$ or lower and a largest diameter of at least 2 cm and are transparent bulk single crystals. The single crystals preferably have a dislocation density of $10^2/cm^2$ or lower and more preferably substantially no dislocation (for instance, $10^1/cm^2$ or lower). The largest diameter of the single crystals is, for instance, at least 2 cm, preferably at least 3 cm, and more preferably at least 5 cm. The larger the largest diameter, the more preferable the single crystals. The upper limit thereof is not limited. Since the standard for bulk compound semiconductors is two inches, from this viewpoint, the largest diameter preferably is 5 cm. In this case, the largest diameter is in the range of, for instance, 2 cm to 5 cm, preferably 3 cm to 5 cm, and more preferably 5 cm. In this context, the "largest diameter" is the length of the longest line that extends between one point and another point on the periphery of the single crystals.

The semiconductor device of the present invention includes the transparent Group-III-element nitride single crystals of the present invention. Preferably, the semiconductor device of the present invention includes a semiconductor layer and this semiconductor layer is formed of the transparent Group-III-element nitride single crystals of the present invention.

An example of the semiconductor device of the present invention includes a field-effect transistor element in which a conductive semiconductor layer is formed on an insulating semiconductor layer, and a source electrode, a gate electrode, and a drain electrode are formed thereon. In this example, at least one of the insulating semiconductor layer and the conductive semiconductor layer is formed of the transparent Group-III-element nitride single crystals of the present invention. Preferably, this semiconductor device further includes a substrate, the field-effect transistor element is formed on the substrate, and the substrate is formed of the transparent Group-III-element nitride single crystals of the present invention.

Another example of the semiconductor device of the present invention includes a light-emitting diode (LED) element including an n-type semiconductor layer, an active region layer, and a p-type semiconductor layer that are stacked together in this order, wherein at least one of the three layers is formed of the transparent Group-III-element nitride single crystals of the present invention. Preferably, this semiconductor device further includes a substrate, the light-emitting diode element is formed on the substrate, and the substrate is formed of the transparent Group-III-element nitride single crystals of the present invention.

Still another example of the semiconductor device of the present invention includes a laser diode (LD) element including an n-type semiconductor layer, an active region layer, and a p-type semiconductor layer that are stacked together in this order, wherein at least one of the three layers is formed of the transparent Group-III-element nitride single crystals of the present invention. Preferably, this semiconductor device further includes a substrate, the laser diode element is formed on the substrate, and the substrate is formed of the transparent Group-III-element nitride single crystals of the present invention.

EXAMPLES

Next, examples of the present invention are described.

Example 1

Figure 4:
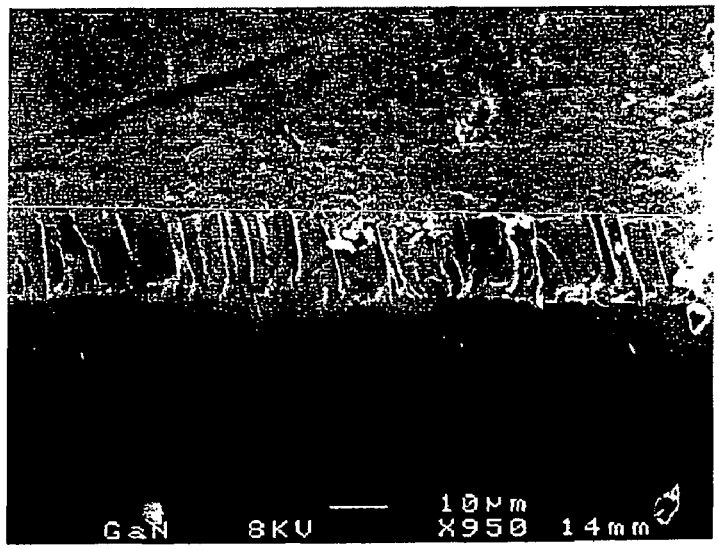
FIG. 4 is a SEM micrograph of gallium nitride single crystals obtained in another example of the production method according to the present invention.

Gallium nitride single crystals were produced using the apparatus shown in FIG. 1. First, GaN thin-film crystals were formed on the surface of a sapphire substrate 8 by the MOCVD method. The substrate 8 was placed at one end (in this example, the "end" refers to a part that moves up and down when the reaction vessel is rocked) of the reaction vessel. The boron nitride reaction vessel 3 in which 2.0 g of gallium and 5.77 g of flux material (sodium) had been put was placed in the heating container 2. The temperature thereof was raised to a growth temperature of 890° C. While the temperature was raised, nitrogen gas 7 was fed into the heating container 2 through the pipe 4 to increase the pressure to a predetermined pressure. In this case, until the heating container 2 was heated to the predetermined temperature, the substrate 8 was prevented from coming into contact with the flux, with the reaction vessel 3 being tilted. The flux component was sodium only. The growth conditions included a pressure of 9.5 atm (9.5×1.013×105 Pa), a growth time of four hours, and a rocking speed of 1.5 reciprocations per minute (in terms of the number of times the substrate is rocked up and down). Since the substrate 8 was placed at one end of the reaction vessel 3, the solution covered and uncovered the surface of the substrate repeatedly when the reaction vessel 3 was rocked. After the crystal growth was completed, the reaction vessel 3 was kept tilted to prevent the substrate 8 from coming into contact with the flux. As a result of the crystal growth carried out as above, transparent bulk gallium nitride single crystals with a uniform thickness grew on the substrate 8 and had a thickness of about 15 μm as shown in the micrograph taken with the scanning electron microscope (SEM; with a magnification of 950 times) shown in FIG. 4. Thus it was proved that a growth rate exceeding 4 μm/hour was achieved. Furthermore, no undesired compounds or the like were produced in the single crystals obtained herein.

Example 2

Figure 5:
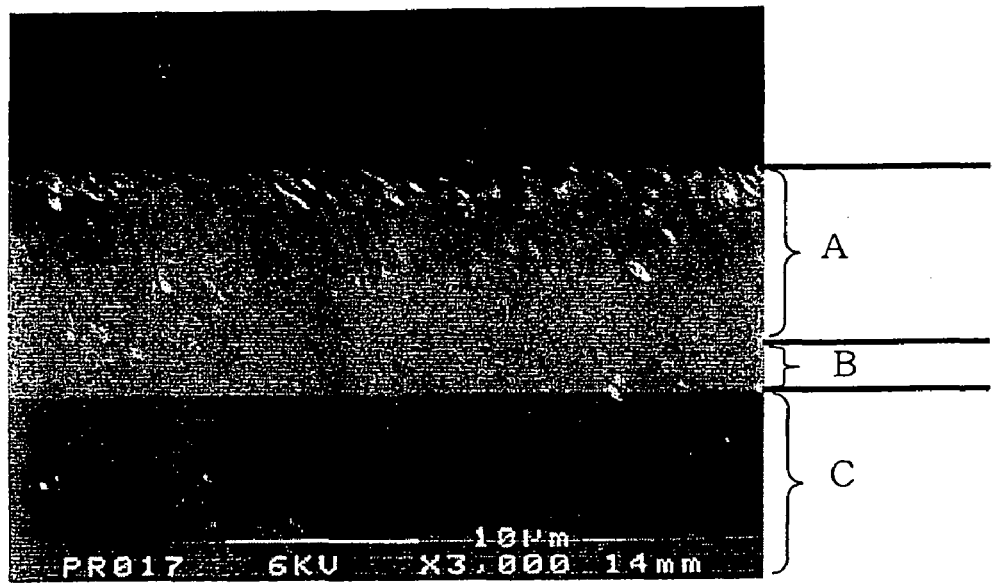
FIG. 5 is a SEM micrograph of gallium nitride single crystals obtained in still another example of the production method according to the present invention.

Gallium nitride single crystals were produced using the apparatus shown in FIG. 1. First, a 3-μm thick GaN film was formed on a sapphire substrate 8 by the MOCVD method. This substrate 8 was placed on one side on the bottom of the boron nitride reaction vessel 3. Then 3.0 g of gallium and a flux material (8.78 g of sodium and 0.027 g of lithium (sodium:lithium=99:1 (mol))) were put into the reaction vessel 3. This reaction vessel 3 was set in the heating container 2. The reaction vessel 3 was tilted in a certain direction to prevent the substrate surface from coming into contact with the raw material. Thereafter, nitrogen gas was fed to increase the pressure to 10 atm (10×1.013×105 Pa) and then the reaction vessel 3 was heated to 890° C. After the rise in temperature and pressure was completed, the reaction vessel 3 was rocked to allow the raw material solution to flow from side to side and thereby to allow the surface of the GaN substrate to be covered continuously with a thin layer of a mixed flux of Na and Li (at a rocking speed of 1.5 reciprocations per minute). While the reaction vessel was rocked continuously, the temperature and pressure were maintained uniformly for four hours. During this period, nitrogen gas dissolved in the film-like flux and thereby gallium and nitrogen reacted with each other. Thus, gallium nitride single crystals grew on the substrate 8. After the crystal growth was completed, the reaction vessel 3 was kept tilted to prevent the substrate 8 from coming into contact with the flux. After the temperature fell, the gallium nitride single crystals were taken out without being separated from the substrate. FIG. 5 shows a SEM micrograph (taken with a magnification of 950 times) of the gallium nitride single crystals thus obtained. In FIG. 5, "A" indicates the GaN (LPE-GaN) layer obtained herein, "B" denotes the GaN thin film formed by the MOCVD method, and "C" indicates the sapphire substrate. As shown in FIG. 5, the single crystals obtained herein were 10-μm thick gallium nitride single crystals. The single crystals had a uniform thickness and were transparent, large, and bulk crystals. With respect to the single crystals, photoluminescence (PL) emission intensity was determined. The excitation light source was a He—Cd laser with a wavelength of 325 nm and the intensity thereof was 10 mW. The temperature at which the measurement was carried out was room temperature. In addition, as a comparative example, the gallium nitride single crystals produced by the MOCVD also were subjected to the measurement of PL emission. As a result, the single crystals of the present example exhibited a PL emission intensity that was at least three times higher than that of the comparative example.

Example 3

Figure 6:
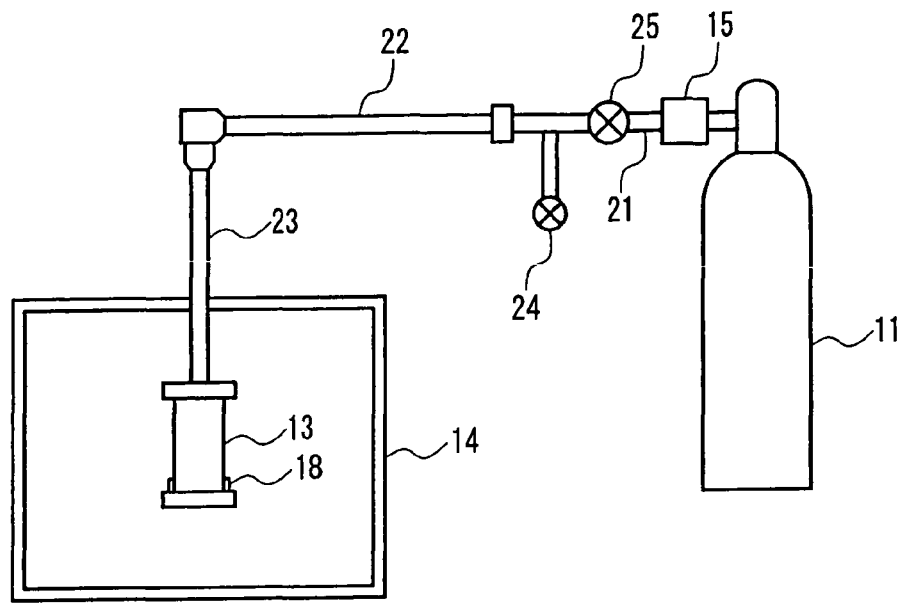
FIG. 6 is a diagram showing the configuration of a manufacturing apparatus that is used in another example of the production method according to the present invention.
Figure 7:
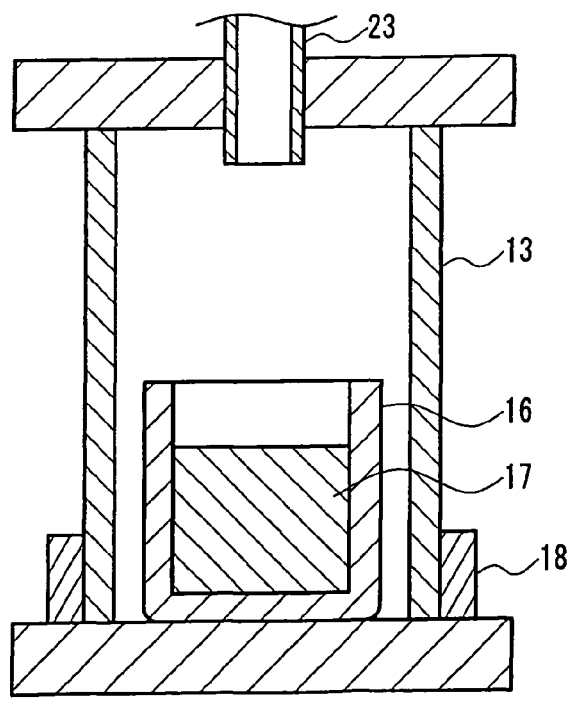
FIG. 7 is an enlarged cross-sectional view of the reaction vessel part of the manufacturing apparatus.

In this example, GaN single crystals were produced while the lower part of the reaction vessel was heated, which generated heat convection and thereby stirred a Na flux and Ga to mix them together, using the apparatus shown in FIGS. 6 and 7. As shown in FIG. 6, this apparatus includes a gas cylinder 11, an electric furnace 14, and a heat- and pressure-resistant container 13 placed in the electric furnace 14. A pipe 21 is connected to the gas cylinder 11 and is provided with a gas pressure controller 15 and a pressure control valve 25. A leak pipe is attached to a middle part of the pipe 21 and a leak valve 24 is disposed at the end of the leak pipe. The pipe 21 is connected to a pipe 22 that is connected to a pipe 23. The pipe 23 enters the electric furnace 14 and is connected to the heat- and pressure-resistant container 13. An electric heater 18 is attached to the outer wall of the lower part of the heat- and pressure-resistant container 13. As shown in FIG. 7, a reaction vessel 16 is disposed in the heat- and pressure-resistant container 13, and Na (0.89 g) and Ga (1.0 g) have been put in the reaction vessel 16. The lower part of the reaction vessel 16 can be heated with the electric heater 18 attached to the outer wall of the lower part of the heat- and pressure-resistant container 13. Using this apparatus, GaN single crystals were grown as follows.

That is, first, nitrogen gas was fed from the gas cylinder 11 into the heat- and pressure-resistant container 13 through the pipes (21, 22, and 23) to allow the inside of the container 13 to have a pressurized atmosphere of 5 atm (5×1.013×105 Pa) while the container 13 was heated to 850° C. by the electric furnace 14. Thus, Na was dissolved and thereby a Na flux was obtained. In heating the heat- and pressure-resistant container 13, the lower part of the reaction vessel 13 was heated at 900° C. from the outer wall thereof with the electric heater 18 and thereby heat convection was generated. Thus, the Na flux and Ga were stirred to be mixed together. As a result, it was observed after the lapse of 45 hours from the start of growth that high quality GaN single crystals were produced.

INDUSTRIAL APPLICABILITY

As described above, the production method of the present invention makes it possible to produce Group-III-element nitride single crystals that have a lower dislocation density and a uniform thickness and are transparent, high quality, large, and bulk crystals, with a high yield.

The invention claimed is:

1. A method for producing Group-III-element nitride single crystals comprising:
   heating a reaction vessel containing a seed substrate for forming the Group-III-element nitride, a flux that comprises at least one metal element selected from the group consisting of an alkali metal and an alkaline-earth metal, and at least one Group III element selected from the group consisting of gallium (Ga), aluminum (Al), and indium (In);
   dissolving a nitrogen-containing gas in the flux of the at least one metal element in which the at least one Group III element is dissolved so as to produce and grow the Group-III-element nitride single crystals on the seed substrate; and
   providing a continuous flow of the flux dissolving nitrogen-containing gas across a surface of the substrate in a thin layer state so as to allow the nitrogen-containing gas to dissolve in the flux and supply nitrogen continuously to growth faces of the crystals,
   wherein the Group-III-element nitride is produced and grown on the seed substrate with the flux containing nitrogen that is supplied from a high-pressure nitrogen-containing gas in a range of pressure from 100 pa to 20 Mpa, and
   the continuous flow of the flux dissolving nitrogen-containing gas across a surface of the substrate in a thin layer state is provided by rocking the reaction vessel in a manner that the reaction vessel is tilted in at least one direction.

2. The method according to claim 1, wherein a thin film of the Group-III-element nitride is formed on the surface of the seed substrate beforehand.

3. The method according to claim 2, wherein the thin film formed on the seed substrate is single crystals of Group-III-element nitride or is amorphous Group-III-element nitride.

4. The method according to claim 1, wherein the at least one Group III element is supplied to the flux while the Group-III-element nitride single crystals grow.

5. The method according to claim 1, wherein the at least one Group III element is gallium (Ga), and the Group-III-element nitride single crystals are gallium (Ga) nitride single crystals.

6. The method according to claim 1, wherein the alkali metal is at least one selected from the group consisting of lithium (Li), sodium (Na), potassium (K), rubidium (Rb), cesium (Cs), and francium (Fr) while the alkaline-earth metal is at least one selected from the group consisting of calcium (Ca), strontium (Sr), barium (Ba), and radium (Ra).

7. The method according to claim 1, wherein the flux of the at least one metal element is a sodium flux, a mixed flux of sodium (Na) and calcium (Ca), or a mixed flux of sodium (Na) and lithium (Li).

8. The method according to claim 1, wherein the at least one Group III element and nitrogen react with each other under conditions including a temperature of 100° C. to 1200° C.

9. The method according to claim 1, wherein the nitrogen (N)-containing gas is at least one of nitrogen ($N_2$) gas and ammonia ($NH_3$) gas.

10. The method according to claim 1, wherein transparent single crystals are grown.

11. The method according to claim 1, wherein Group-III-element nitride single crystals having a dislocation density of $10^4/cm^2$ or lower are grown.

12. The method according to claim 1, wherein Group-III-element nitride single crystals having a largest diameter of at least 2 cm are grown.

* * * * *